United States Patent [19]

Schulze et al.

[11] Patent Number: 4,950,040

[45] Date of Patent: Aug. 21, 1990

[54] MEASURING RANGE SELECTION SWITCH

[75] Inventors: Wolfgang Schulze; Heinrich M. Pekar, both of Nürnberg, Fed. Rep. of Germany

[73] Assignee: ASEA Brown Boveri Aktiengesellschaft, Mannheim, Fed. Rep. of Germany

[21] Appl. No.: 337,354

[22] Filed: Apr. 13, 1989

[30] Foreign Application Priority Data

Apr. 22, 1988 [DE] Fed. Rep. of Germany ....... 3813532

[51] Int. Cl.⁵ ............................................. H03G 3/00
[52] U.S. Cl. ..................................... 330/254; 324/115; 324/123 R; 330/145; 330/284
[58] Field of Search ............... 330/144, 145, 254, 284, 330/311; 324/115, 123 R

[56] References Cited

U.S. PATENT DOCUMENTS 3,452,289  6/1969  Ryan ............................... 330/256 X

FOREIGN PATENT DOCUMENTS 2037695  2/1972  Fed. Rep. of Germany ...... 330/254
197906  11/1983  Japan .................................. 330/254
86909  4/1987  Japan .................................. 330/254

OTHER PUBLICATIONS

Hollstein, Jr., "Gain Change Amplifier", *IBM Technical Disclosure Bulletin*, vol. 10, No. 4, Sep. 1967, pp. 521, 522.

Millican, "Four-Level Gain Control Stage", *IBM Technical Disclosure Bulletin*, vol. 14, No. 9, Feb. 1972, pp. 2639, 2640.

Tietze et al., *Halbleiter-Schaltungstechnik*, Published by Springer Verlag, 1985, p. 731.

*Primary Examiner*—James B. Mullins
*Attorney, Agent, or Firm*—Herbert L. Lerner; Laurence A. Greenberg

[57] ABSTRACT

Appropriately constructed differential amplifiers are suitable as wideband multiplexers. It is the object of the invention to use such amplifiers in conjunction with a measuring range switch. For this purpose, the differential amplifier is equipped with at least three differential amplifier stages, all of which have a common input and different gain due to different current feedback resistors. The switching is effected through blocking transistors, only one of which is optionally switched on in each case and connects a common current source to the associated differential amplifier stage. The invention can be used in measuring technology for multimeters and oscilloscopes.

11 Claims, 3 Drawing Sheets

MEASURING RANGE SELECTION SWITCH

The invention relates to a measuring range selection switch with a switchable differential amplifier having at least two symmetrically constructed differential amplifier stages, in which two emitters of one stage are each connected through a respective current feedback resistor to a blocking transistor, which in turn is connected to a constant current source that is common to the differential amplifier stages, the blocking transistors being controlled through a control circuit in such a manner that alternately one blocking transistor does not cut off and switches on the differential amplifier stage supplied through it with current, and all of the differential amplifier stages are connected to a common output.

In measuring technology, particularly in oscilloscopes, switches are needed for high frequencies. Such switches can be produced with the aid of differential amplifiers. Page 731 of the German publication "Halbleiter-Schaltungstechnik" (Semiconductor Circuit Technology) by Tietze and Schenk, published by Springer Verlag 1985, discloses a wide band multiplexer which has two symmetrically constructed differential amplifier stages in which the two emitters of the two stages are each connected to a blocking transistor through a respective current feedback resistor. The collector-emitter path of the two blocking transistors is located in the connection between the differential amplifier stages and a common constant current source. The blocking transistors can be controlled in such a manner that alternately one of them does not cut off and switches on the differential amplifier stage supplied by it with current. All of the differential amplifier stages have a common output.

Such a multiplexer is suitable for use as modulator, demodulator, phase detector or channel switch, but it cannot be used together with a measuring range switch.

It is accordingly an object of the invention to provide a switchable differential amplifier, which overcomes the hereinafore-mentioned disadvantages of the heretofore-known devices of this general type and which can also be used in conjunction with a measuring range switch.

With the foregoing and other objects in view there is provided, in accordance with the invention, a switchable differential amplifier, comprising at least three symmetrically constructed differential amplifier stages each having two emitters, current feedback resistors each being connected to a respective one of the emitters, the current feedback resistors connected to the different differential amplifier stages having different values, blocking transistors each being connected to the current feedback resistors connected to the two emitters of a respective one of the differential amplifier stages, a constant current source connected in common to all of the differential amplifier stages, a control circuit connected to and controlling the blocking transistors for alternately causing one of the blocking transistors to remain in conduction or not cut off and to optionally switch on only the differential amplifier stage supplied through the one blocking transistor with current, a common output and a common input connected to all of the differential amplifier stages.

Since the differential amplifier stages are operated with an impressed current, their gain can be varied in a simple manner by means of different current feedback resistors. In the measuring range switch provided, at least three differential amplifier stages having different gain are used, only one of which, however, is optionally switched on through the associated blocking transistor.

Compared with conventional measuring range switches operating with controlled reed relays, it is a significant advantage of the circuit according to the invention that not only is a switch-over effected, but at the same time, a signal amplification can also be achieved. Furthermore, the differential amplifier can be constructed in conjunction with an integrated circuit and disposed, for example, on an analog array. The circuit can thus be produced by rational production techniques and accommodated in the smallest possible space.

In accordance with another feature of the invention, there is provided another control input, the blocking transistors being in the form of three blocking transistors being switched on and off by the two control inputs, and an auxiliary stage connected to the input of one of the three blocking transistors for cutting off the one blocking transistor as soon as one of the other two of the blocking transistors is opened.

An essential improvement of the subject-matter of the invention is the fact that the three differential amplifier stages are controlled from only two control inputs. This measure is of significance because only a limited number of externally accessible connections can be implemented in the case of an integrated semiconductor, e.g. an analog array. In the case of complicated circuits, economic allocation of the connections must therefore be considered. The control inputs of the two blocking transistors are therefore combined with one another through the auxiliary stage in such a manner that the control signal having two levels and emitted by a control circuit in each case closes the two other blocking transistors as soon as one of the blocking transistors is opened.

In accordance with a further feature of the invention, the blocking transistors each have a base, a collector and an emitter, defining a collector-emitter branch connected between the constant current source and a respective one of the differential amplifier stages, and there are provided voltage dividers each being connected between the base of a respective one of the blocking transistors and a bias voltage for opening the blocking transistor, the bias voltage having a control voltage superimposed thereon which has either a "zero" (open collector) value or a value cutting off the blocking transistors, the control voltage ($-5$ volts) effecting a blocking always being directly supplied to the base of two of the blocking transistors from the two control inputs and being supplied to the third of the blocking transistors through the auxiliary stage.

In accordance with an added feature of the invention, there is provided another voltage divider connected between the two control inputs, the auxiliary stage being formed of a transistor having a base connected to the other voltage divider, an emitter connected to a voltage effecting blocking and a collector connected to the base of the third of the blocking transistors, the other voltage divider causing the auxiliary stage transistor to cut off the auxiliary stage as soon as a corresponding voltage is present at both of the control inputs.

In accordance with an additional feature of the invention, the constant current source is a current balancing circuit, and the common output of the differential amplifier stage is a cascode. The balancing circuit makes it possible to increase the temperature stability of the circuit and a good frequency characteristic can be achieved by means of the cascode.

In connection with a measuring range switch, in accordance with yet another feature of the invention, the gain of the individual differential amplifier stages is fixed in such a way that the current feedback resistors provide the three differential amplifier stages with preset voltage ratios of 1:1, 1:2 and 1:5 between input and output voltage. This dividing ratio, in conjunction with a decadic voltage division, enables various measuring ranges to be advantageously formed.

In accordance with yet a further feature of the invention, there is provided a first part of the measuring range switch having an output connected to the common input of the three differential amplifier stages, first part of the measuring range switch including voltage dividers having resistors for presetting a respective measuring range, switching transistors operating as emitter followers, having bases, collectors and emitters and connecting different voltage divider resistors to the common input in dependence on signals of the control circuit, each divider voltage picked up at the voltage divider resistors being supplied to the base of the switching transistor, a common output resistor connected to the emitters of all of the switching transistors, and control transistors having inputs, each of the control transistors being connected to the base of a respective one of the switching transistors for preventing only the switching transistor associated with a measuring range preset in each case from being connected to cut-off potential, in dependence on signals of the control circuit present at the input of the control transistors.

It is necessary to connect a first part of the measuring range switch in series which reduces high voltages to permissible values with the aid of a voltage divider, in order to adapt the measurement signal to the signal range which can be accommodated by the differential amplifier. Transistors should be used as switches so that this also can be included at least extensively into the integrated circuit. The proposed circuit advantageously differs from known emitter followers used as switches firstly in that the voltage to be switched, which comes from the voltage divider in this case, is not supplied to the collector but to the base of the switching transistor. This remains without influence on the measurement signal because the emitter follower ensures a gain ratio of 1:1. The control transistor which pulls the base of the switching transistor to blocking potential for blocking the switching transistor, and to which the control signal is applied, ensures the switching on and off of the switching transistor. The second switching transistor, which picks up a partial voltage derived from the measurement signal at a voltage divider, operates with the same emitter resistor as the first switching transistor. Without further measures, this ensures a common output, which is to be connected to the input of the differential amplifier.

In accordance with yet an added feature of the invention, the switching transistors are in the form of first and second switching transistors, the control transistors are in the form of first and second control transistors, the inputs of the first and second control transistors are combined to form one input, and there is provided an inverter connected upstream of the second control transistor for inverting a signal coming from the control circuit to cause the second switching transistor to cut off when the first switching transistor is opened, and causing the first switching transistor to cut off while the second control transistor is opened with a second signal of the control circuit having another level.

In this case too, it is advantageous to keep the number of control inputs as low as possible, with regard to the integrated circuit. Combining two control inputs is made possible by the fact that the second control transistor is preceded by the inverter which inverts the signal coming from the control circuit in such a manner that the second switching transistor associated with it cuts off when the first switching transistor is opened. The converse correspondingly holds true. It is possible in this manner to selectively operate both the first and the second switching transistor with only one control signal identifying two states or levels.

In accordance with yet an additional feature of the invention, the first part of the measuring range switch has an input, the switching transistors are connected to the voltage divider resistors and the voltage divider resistors are dimensioned to form voltage ratios of 1:1 and 10:1 between the input and the output of the measuring range or voltage switch, and the control circuit in each case combines a given differential amplifier stage with a given switching transistor by switching-on to obtain a predetermined overall transformation ratio.

Therefore, the first switching transistor is used to implement a voltage transformation of 1:1 and the second switching transistor is used to implement a voltage transformation of 10:1, in order to achieve an advantageous overall transformation ratio in conjunction with the differential amplifier.

In accordance with a concomitant feature of the invention, all of the transistors are of the same type, preferably NPN, the resistors have values selected from the group consisting of 100 ohms 200 ohms, 400 ohms, 800 ohms, 1 kilo Ohm, 2 kilo Ohms, 4 kilo Ohms, 8 kilo Ohms and 16 kilo Ohms, and the switchable differential amplifier is constructed on an analog array.

All of the transistors are selected of the same type in order to implement the circuit with the aid of an analog array. The number of resistors which can be used is also limited in this case, which must be taken into consideration in the dimensioning of the circuit.

Other features which are considered as characteristic for the invention are set forth in the appended claims.

Although the invention is illustrated and described herein as embodied in a switchable differential amplifier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
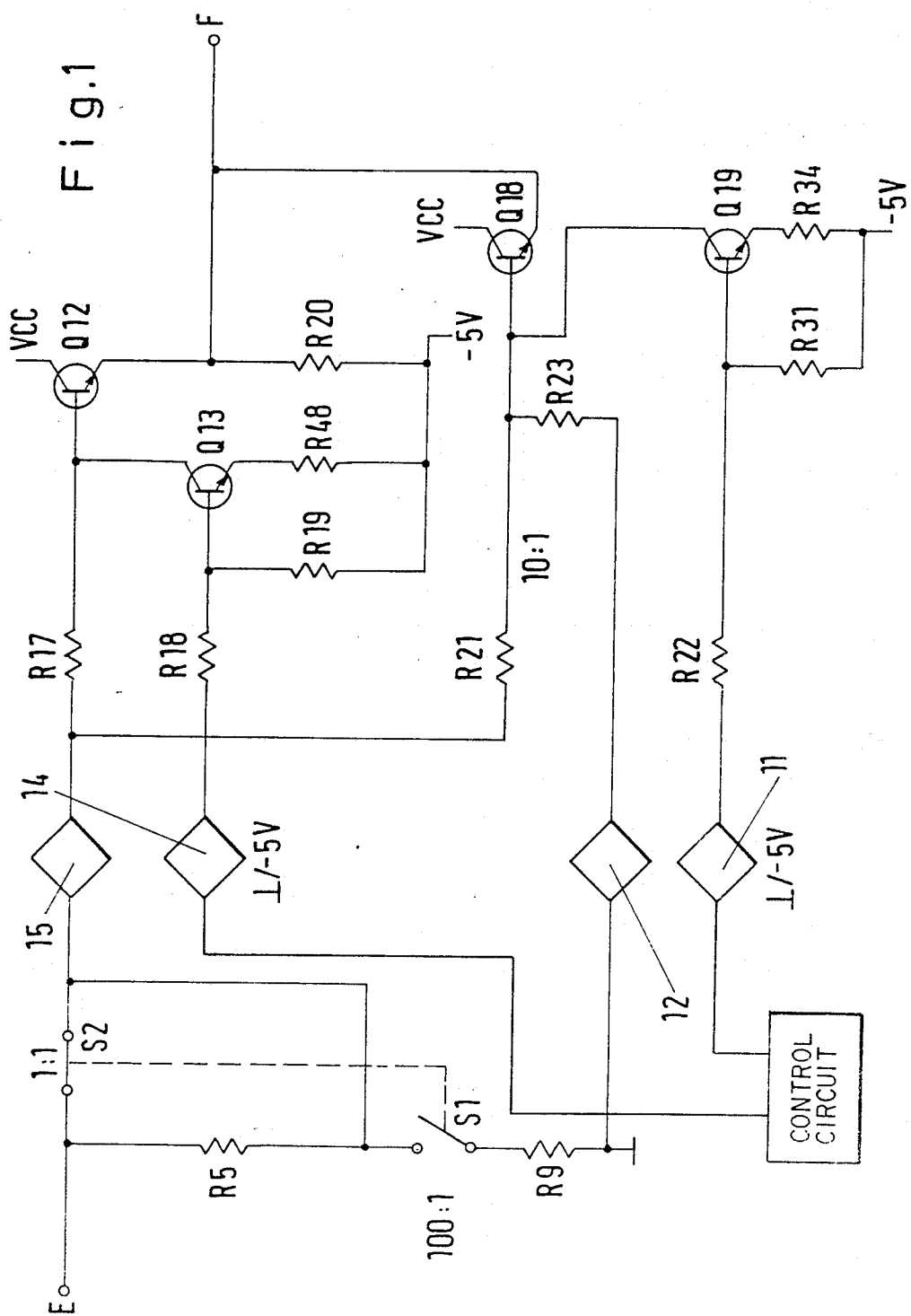
FIG. 1 is a schematic circuit diagram of a measuring range switch having two control inputs.

Referring now to the figures of the drawings in detail and first, particularly, to FIG. 1 thereof, there is seen a measuring range switch which has a basic configuration including first and second switching transistors Q12, Q18, operating as emitter followers, with a common output F and a common emitter resistor R20 which is connected to −5 volts. While the collector of each of the two switching transistors Q12, Q18 is connected to a collector voltage VCC, in each case the base is connected to an input connection 15 through a respective resistor R17, R21. Furthermore, the base-emitter path of both switching transistors Q12, Q18 with the emitter resistor R20 connected in series, is bypassed by the collector-emitter path of a respective first or second control transistor Q13, Q19 with a series-connected further emitter resistor R48, R34. The base of each control transistor Q13, Q19 is connected to a respective control input 14; 11 through a respective voltage divider R18, R19; R22, R31.

The output signal of an electronic control circuit, which is responsible for the automatic measuring range switching, is present at the control inputs 14; 11 of the measuring range switch. It ensures that in each case the correct measuring range is switched on in dependence on the magnitude of the measurement signal. Circuits of this type are known and therefore not shown in greater detail. Only the output signal of the control circuit which can change between a level which is at zero potential and −5 volts, is of significance for the operation of the circuit according to the invention. If zero potential reaches the bases of the two control transistors Q13, Q19, a current flows through the base-emitter path, opens the control transistor and, as a result, pulls the base of the switching transistors Q12, Q19 to blocking potential. Thus, if one of the two switching transistors is to be switched to conduction, the level of −5 volts must reach the base of the associated control transistor through the associated control input. This cuts off the control transistor and thus leaves the base-emitter circuit of the switching transistor unaffected.

The control circuit can be used as required, to switch the first switching transistor Q12 or the second switching transistor Q18 to conduction. Both transistor stages have a gain of 1:1. However, while the first switching transistor Q12 is directly connected to the input connection 15 through the bias resistor R17, the bias resistor R21 which is also connected to the input connection 15, forms a voltage divider of 10:1 with a further resistor R23 that is connected to zero potential. Thus, the first switching transistor Q12 is switched to conduction with a divider ratio of 1:1 and the second switching transistor Q18 is switched to conduction with a divider ratio of 10:1.

It requires no further explanation that further emitter follower stages can be connected to the common emitter resistor R20 in order to achieve other voltage divider ratios. However, with a voltage divider ratio of 100:1 the voltages present at the voltage divider resistors are so high that it is not recommended to connect them into an integrated circuit. Therefore, the associated voltage divider is conventionally implemented with the aid of a voltage divider R5, R9 disposed outside the integrated circuit and with a relay having switching paths S1, S2. With a required divider ratio of 100:1, the switch S1 is closed and the switch S2 is opened and the current flows through the switching transistor Q12 to the output F. A divider ratio of 1000:1 could be achieved if the switching transistor Q18 is switched to conduction together with the switching path S1.

Figure 2:
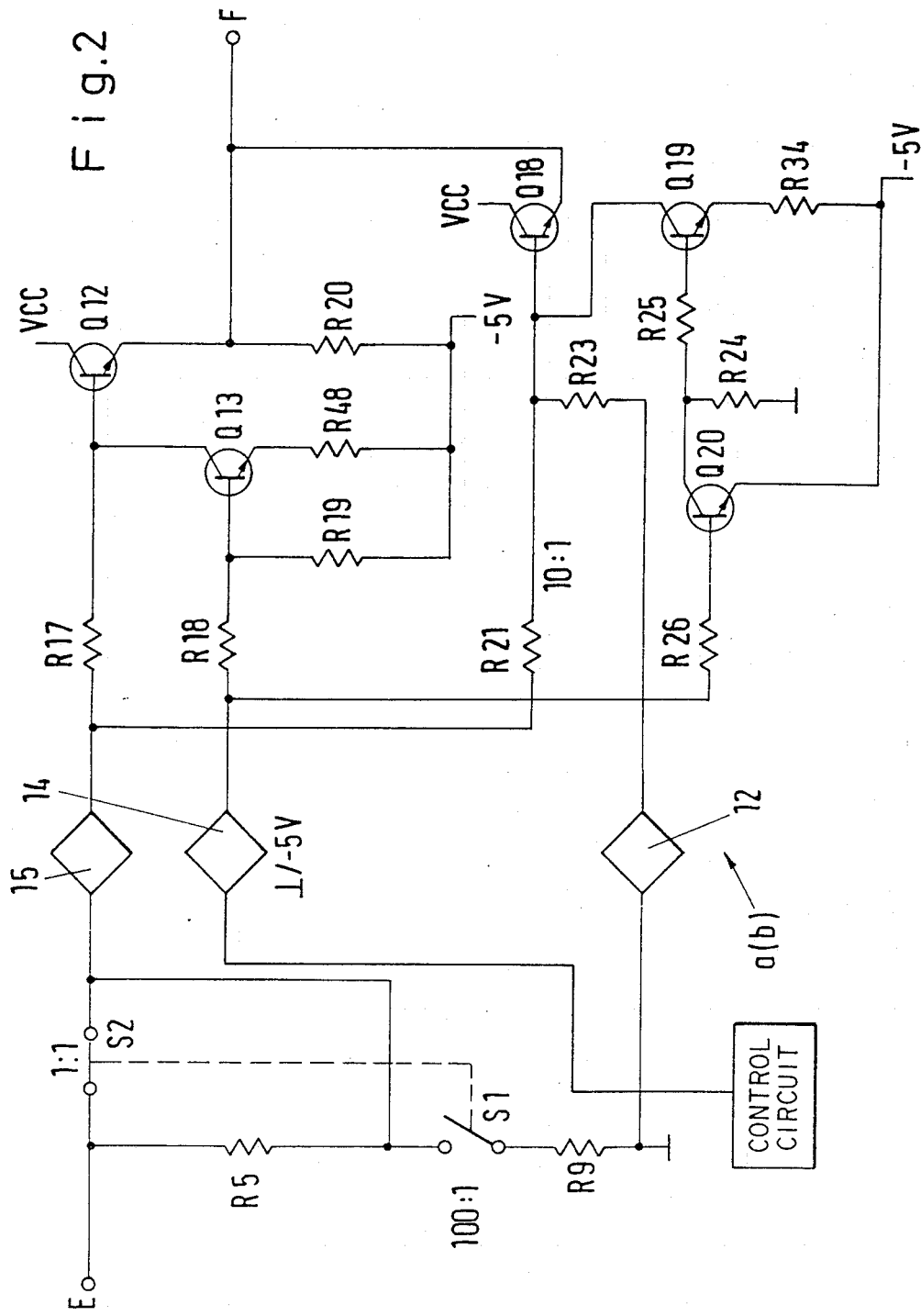
FIG. 2 is a circuit diagram of a measuring range switch having one common control input.

Compared with the circuit of FIG. 1, the circuit of FIG. 2 is improved insofar as it manages with only one control input 14 for both control transistors Q13, Q19. For this purpose, the base of the second control transistor Q19 is connected through a bias resistor R25 to a collector resistor R24 of an inverter stage with a transistor Q20 having an emitter which is connected to −5 volts and a base which is connected to the common input 14 through a bias resistor R26. The inverter Q20 ensures that the second control transistor Q19 is cut off whenever the first control transistor Q13 is switched to conduction. Since, in any case, only one of the two switching transistors Q12, Q19 is permitted to be switched on, this results in the saving of one input connection in a simple manner.

Figure 3:
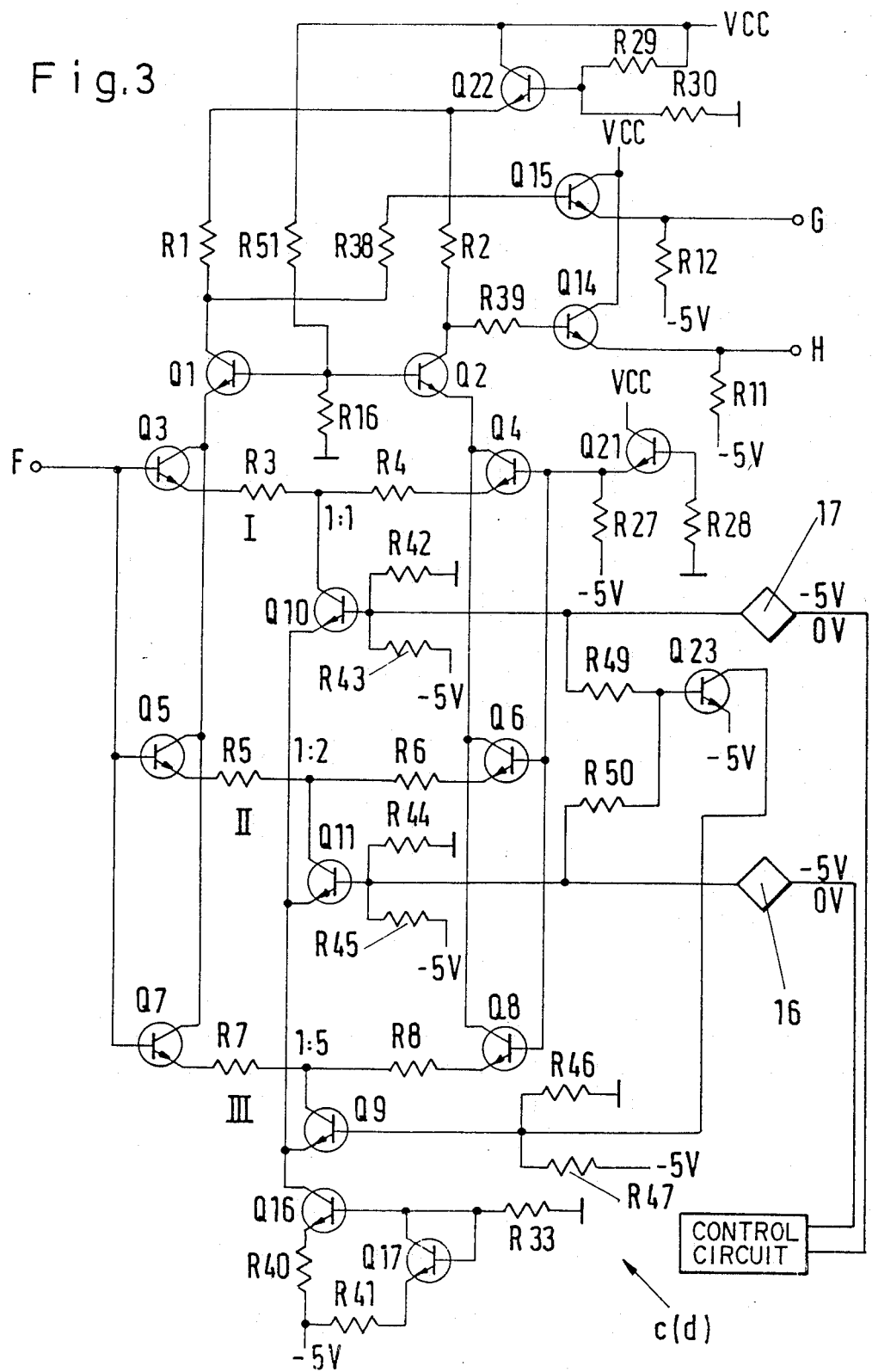
FIG. 3 is a circuit diagram of a differential amplifier group, which supplements the measuring range switch, with switchable differential amplifier stages of different gain.

An essential improvement of the measuring range switch is achieved with the aid of the circuit according to FIG. 3. The circuit involves three symmetrically constructed differential amplifier stages I, II, III, having emitters which are connected through current feedback resistors R3 to R8 to a constant current source Q16, Q17. The constant current source is constructed as a current balancing circuit and thus ensures good temperature stability. Each differential amplifier stage I, II, III has two feedback resistors R3, R4; R5, R6; R7, R8 which differ in their value from that of the other two differential amplifiers stages. This results in different feedback and thus in different gain for the individual differential amplifier stages. All of the differential amplifier stages have a first difference input which is formed by the base of the transistors Q3, Q5, Q7 and is connected to the output F of the circuit described above. The differential amplifier stages each have a second difference input formed by the bases of the transistors Q4, Q6, Q8, which are connected through the emitter of a transistor Q21, connected as an emitter follower, to a base resistor R28 and to an output resistor R27.

The collectors of the transistors Q3, Q5, Q7 are jointly connected to the emitter of a first cascode transistor Q1 having a collector connected through a resistor R38 to the base of a further emitter follower Q15 which in turn is connected to a first difference output G. The second output for all of the differential amplifiers stages with the transistors Q4, Q6, Q8 is connected through a second cascode with a transistor Q2, a resistor R39 and the base of a further emitter follower Q14 to a second difference output H. The bases of the two cascode transistors Q1, Q2 are interconnected and in turn connected to a voltage divider R51, R16 which is connected on one hand, to the supply voltage VCC and on the other hand, to zero potential. The collectors of the two cascode transistors Q1, Q2 are likewise connected to the supply voltage source VCC, through resistors R1, R2 and a transistor stage Q22.

Each of the differential amplifier stages I, II, III formed of the two transistors Q3, Q4; Q5, Q6; Q7, Q8 is not connected directly through the feedback resistors R3, R4; R5, R6; R7, R8 thereof to the constant power or current source Q16, Q17, but instead through the collector-emitter path of a first, second or third blocking transistor Q10, Q11, Q9. In this configuration, in each case the emitter of a blocking transistor is connected to the constant current source while the collector thereof is connected to the two associated feedback resistors. The bases of the three blocking transistors Q10, Q11, Q9 are each connected to a respective voltage divider R42, R43; R44, R45; R46, R47 which have one end connected to −5 volts and the other end connected to zero potential. Furthermore, the base of the blocking transistor Q10 is directly connected to a control input 17 and the base of the blocking transistor Q11 is directly connected to a control input 16. Between the two control inputs 16, 17, is a voltage divider R49, R50 to which the base of a transistor Q23, forming an auxiliary stage, is connected. The emitter of the transistor Q23 is connected to −5 volts and the collector thereof is connected to the base of the third blocking transistor Q9.

Starting from the control circuit, it is possible to supply the control inputs 16, 17 with a signal level of −5 volts which is superimposed on the bias voltage of the blocking transistors Q10, Q11 and blocks the latter. In this case, the auxiliary stage formed by the transistor Q23 also cuts off since −5 volts are present both at the base and at the emitter of the transistor. Thus, no blocking potential is supplied to the base of the third blocking transistor Q9 so that it switches to conduction. In this case, only the third differential amplifier stage III is therefore supplied with current so that only this stage is switched on and determines the respective gain ratio through its current feedback resistors R7, R8.

The circuit is controlled in such a manner that in each case only one of the differential amplifiers stages is switched on. For this purpose, it must be possible to optionally apply a second input level of 0 volts (open collector) to the two control inputs 16, 17. If this level is present, e.g at the control input 17, the bias voltage present at the first blocking transistor Q10 remains unchanged and switches the latter to conduction. At the same time, the auxiliary stage with the transistor Q23 is also switched to conduction since its base receives positive potential. As a result, the base of the third blocking transistor Q9 is connected to a blocking potential of −5 volts which leads to its being cut off. Analogous conditions are produced as soon as 0 volts are present at the control input 16.

Naturally, the auxiliary stage with the voltage divider R49, R50 and the transistor Q23 could be omitted if the base of the third blocking transistor Q9 were also to be connected to a control input of its own. However, since only a small number of external connections are available with the analog array used, it is a significant advantage to save one connection by means of the auxiliary stage. The following truth table is obtained for the circuit:

| Transistor switches to conduction | Control signal at input: | |
| --- | --- | --- |
|  | 17 | 16 |
| Q10 | 0 V | −5 V |
| Q11 | −5 V | 0 V |
| Q9 | −5 V | −5 V |
| illegal | 0 V | 0 V |

The use of differential amplifier stages in conjunction with a measuring range switch, provides the advantage that not only is the measuring range switched but, at the same time, a signal amplification can also be achieved.

The foregoing is a description corresponding in substance to German Application P 38 13 532.9, dated Apr. 22, 1988, the International priority of which is being claimed for the instant application, and which is hereby made part of this application. Any material discrepancies between the foregoing specification and the aforementioned corresponding German application are to be resolved in favor of the latter.

We claim:

1. Measuring range selection switch for a measuring device to selectively divide a measuring voltage into smaller values under control of an external control circuit, comprising a first circuit part of the measuring range selection switch for dividing the measuring voltage into decimal steps, a second circuit part of the measuring range selection switch having an input connected to an output of said first circuit part for dividing the measuring voltage a second time into still smaller steps, said second circuit part including three symmetrically constructed differential amplifier stages each having two transistors, each transistor having only one emitter, current feedback resistors each being connected to a respective one of said emitters, said current feedback resistors respectively connected to said differential amplifier stages to provide said differential amplifier stages with respective preset voltage ratios of steps smaller than decadic steps between input and output voltage, a blocking transistor for each differential amplifier, each blocking transistor connected to said respective feedback resistor, a constant current source connected in common to all of said differential amplifier stages, the control circuit connected to said blocking transistors for selectively causing one of said blocking transistors to remain in conduction and to switch on only said respective differential amplifier stage supplied through said one blocking transistor with current, so that one attenuation step combined with one amplification ratio is selected for the measurement, a common output and a common input connected to all of said differential amplifier stages, wherein said measuring range selection switch has an output stage including a pair of emitter followers.

2. Measuring range selection switch according to claim 1, wherein one of said three blocking transistors is selectively switched on and off, only two control inputs for switching on and off one of said three blocking transistors, and an auxiliary stage connected to the input of one of said three blocking transistors for switching off one of said blocking transistors as soon as one of the other two of said blocking transistors is opened.

3. Measuring range selection switch according to claim 2, wherein said blocking transistors each have a base, a collector and an emitter, defining a collector-emitter branch connected between said constant current source and a respective one of said differential amplifier stages, and including a voltage divider each being connected between the base of a respective one of said blocking transistors and a bias voltage for opening said blocking transistor, said bias voltage having a control voltage superimposed thereon being selectable between a zero value and a value cutting off said blocking transistors, said control voltage effecting a blocking being directly supplied to the base of two of said blocking transistors from said two control inputs and being supplied to the third of said blocking transistors through said auxiliary stage.

4. Measuring range selection switch according to claim 3, including another voltage divider connected between said two control inputs, said auxiliary stage being formed of a transistor having a base connected to said other voltage divider, an emitter connected to a voltage effecting blocking and a collector connected to the base of the third of said blocking transistors, said other voltage divider causing said auxiliary stage transistor to cut off said auxiliary stage as soon as a corresponding voltage is present at both of said control inputs.

5. Measuring range selection switch according to claim 1, wherein said constant current source is a current balancing circuit, and said common output of said differential amplifier stage is a cascode.

6. Measuring range selection switch according to claim 1, wherein said first circuit part has said output connected to said common input of said three differential amplifier stages of said second part of said range selection switch, including voltage dividers having voltage divider resistors for presetting a respective measuring range, switching transistors operating as emitter followers, having bases, collectors and emitters and connecting different voltage divider resistors to said common input in dependence on signals of said control circuit, each divider voltage picked up at said voltage divider resistors being supplied to the base of said switching transistor, a common output resistor connected to the emitters of all of said switching transistors, and control transistors having inputs, each of said control transistors being connected to the base of a respective one of said switching transistors for preventing only said switching transistor associated with a measuring range preset in each case from being connected to cut-off potential, in dependence on signals of said control circuit present at the input of said control transistors.

7. Measuring range selection switch according to claim 6, wherein said switching transistors are in the form of first and second switching transistors, said control transistors include first and second control transistors, said first and second control transistors are controlled from one input, including an inverter connected upstream of said second control transistor for inverting a signal coming from said control circuit to cause said second switching transistor to cut off when said first switching transistor is opened, and causing said first switching transistor to cut off while said second control transistor is opened with a second signal of said control circuit having another level.

8. Measuring range selection range according to claim 7, wherein said first part of said measuring range selection switch has an input, said switching transistors are connected to said voltage divider resistors and said voltage divider resistors are dimensioned to form voltage ratios of 1:1 and 10:1 between the input and said output of said first part of the range selection switch, and said control circuit in each case combines a given differential amplifier stage with a given switching transistor by switching-on to obtain a predetermined overall voltage ratio.

9. Measuring range selection switch according to claim 1, wherein all of said transistors are of the same type.

10. Measuring range selection switch according to claim 9, wherein all of said transistors are NPN transistors.

11. Measuring range selection switch according to claim 1, wherein all of said transistors are NPN transistors.

* * * * *